(12) United States Patent
Lipinski et al.

(10) Patent No.: US 8,349,528 B2
(45) Date of Patent: Jan. 8, 2013

(54) SEMICONDUCTOR DEVICES AND METHODS OF MANUFACTURING THEREOF

(75) Inventors: Matthias Lipinski, Poughkeepsie, NY (US); Alois Gutmann, Poughkeepsie, NY (US); Jingyu Lian, Hopewell Junction, NY (US); Chandrasekhar Sarma, Poughkeepsie, NY (US); Haoren Zhuang, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 13/164,139

(22) Filed: Jun. 20, 2011

(65) Prior Publication Data
US 2011/0250530 A1    Oct. 13, 2011

Related U.S. Application Data

(62) Division of application No. 11/343,161, filed on Jan. 30, 2006, now Pat. No. 8,007,985.

(51) Int. Cl.
*G03F 1/00*    (2012.01)

(52) U.S. Cl. ........................................... 430/5

(58) Field of Classification Search .............. 430/5, 322, 430/394
See application file for complete search history.

(56) References Cited

U.S. PATENT DOCUMENTS

| | | | |
|---|---|---|---|
| 6,013,570 A | 1/2000 | Yu et al. | |
| 2002/0142252 A1 | 10/2002 | Ng | |
| 2003/0045118 A1 | 3/2003 | Wu et al. | |
| 2004/0198030 A1 | 10/2004 | Buehrer et al. | |
| 2005/0238965 A1* | 10/2005 | Tyrrell et al. | 430/5 |
| 2006/0057471 A1* | 3/2006 | Schenau et al. | 430/5 |
| 2006/0170898 A1* | 8/2006 | Finders | 355/69 |
| 2006/0183348 A1* | 8/2006 | Meagley et al. | 438/789 |
| 2007/0117041 A1* | 5/2007 | Noelscher et al. | 430/270.1 |

\* cited by examiner

*Primary Examiner* — Brittany Raymond
(74) *Attorney, Agent, or Firm* — Slater & Matsil, L.L.P.

(57) ABSTRACT

Semiconductor devices and methods of manufacturing thereof are disclosed. A plurality of features is formed on a workpiece, the plurality of features being located in a first region and a second region of the workpiece. Features in the first region have a first lateral dimension, and features in the second region have a second lateral dimension, wherein the second lateral dimension is greater than the first lateral dimension. The first region is masked, and the second lateral dimension of features in the second region is reduced.

18 Claims, 4 Drawing Sheets

SEMICONDUCTOR DEVICES AND METHODS OF MANUFACTURING THEREOF

This application is a divisional of patent application Ser. No. 11/343,161, entitled "Semiconductor Devices and Methods of Manufacturing Thereof," filed on Jan. 30, 2006, which application is incorporated herein by reference.

TECHNICAL FIELD

The present invention relates generally to the fabrication of semiconductor devices, and more particularly to the patterning of material layers of semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (ICs). There may be a plurality of transistors, memory devices, switches, conductive lines, diodes, capacitors, logic circuits, and other electronic components formed on a single die or chip, for example.

Optical photolithography involves projecting or transmitting light through a pattern made of optically opaque or translucent areas and optically clear or transparent areas on a mask or reticle. For many years in the semiconductor industry, optical lithography techniques such as contact printing, proximity printing, and projection printing have been used to pattern material layers of integrated circuits. Lens projection systems and transmission lithography masks are used for patterning, wherein light is passed through the lithography mask to impinge upon a semiconductor wafer or workpiece.

There is a trend in the semiconductor industry towards scaling down the size of integrated circuits, to meet the demands of increased performance and smaller device size. As features of semiconductor devices become smaller, it becomes more difficult to pattern the various material layers because of diffraction and other effects that occur during the lithography process. In particular, lithography techniques used to pattern the various material layers become challenging as device features shrink. For example, in some etch processes, closely-spaced features tend to be etched more rapidly than widely-spaced features, resulting in the closely-spaced features being thinner than the widely-spaced features, which can be a problem in some applications.

Thus, what are needed in the art are improved methods of patterning material layers of semiconductor devices.

SUMMARY OF THE INVENTION

These and other problems are generally solved or circumvented, and technical advantages are generally achieved, by preferred embodiments of the present invention, which provide novel methods of manufacturing semiconductor devices, methods of patterning material layers of semiconductor devices, method of designing lithography mask sets, and novel lithography mask sets and lithography systems.

Embodiments of the present invention provide methods of forming features having substantially the same lateral dimensions in a first region and a second region of a semiconductor device.

In accordance with a preferred embodiment of the present invention, a method of manufacturing a semiconductor device includes providing a workpiece and forming a plurality of features on the workpiece. The plurality of features is disposed in a first region and a second region of the workpiece. At least one first feature in the first region includes a first lateral dimension, and at least one second feature in the second region includes a second lateral dimension, wherein the second lateral dimension is greater than the first lateral dimension. The first region of the workpiece is masked, and the second lateral dimension of the at least one second feature in the second region is reduced.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely the patterning of material layers of semiconductor devices. Embodiments of the invention may also be applied, however, to other applications where material layers are patterned, for example.

In the manufacturing of integrated microelectronic circuits, it is desirable to pattern certain features independently of the environment they are in on the workpiece, e.g., regardless of the region of the workpiece the features are located in. For example, generally, features with a predetermined target dimension should be manufactured as closely as possible to the target dimension, regardless of what the other surrounding features are, and regardless of density of the features. However, achieving a target dimension is particularly problematic when there are nested (e.g., closely-spaced) features and isolated (widely-spaced) features on a workpiece. For example, in prior art dry etch processes used to pattern polysilicon gates of transistors, features in nested regions tend to be etched more than features in isolated regions, resulting in smaller, narrower, features in the nested regions.

Figure 1:
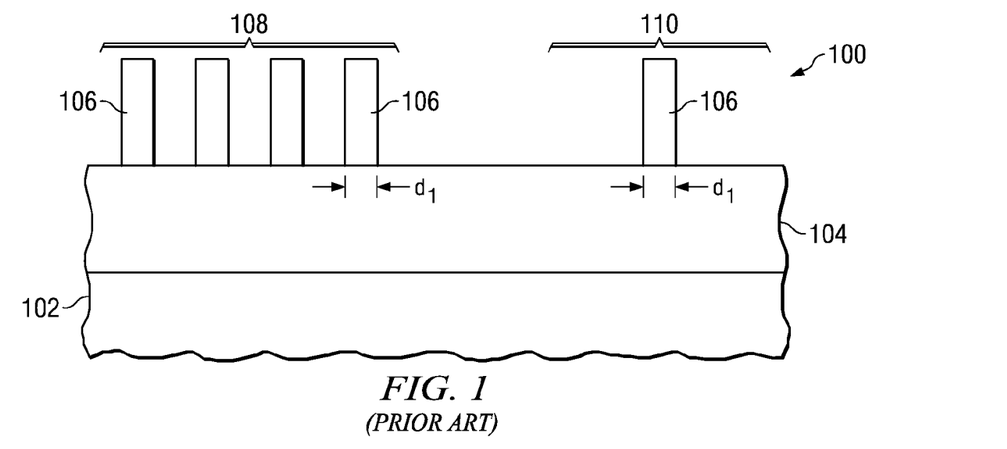
FIGS. 1 and 2 show cross-sectional views of a prior art method of patterning a material layer of a semiconductor device, wherein features formed in closely-spaced or nested regions are thinner than features formed in widely-spaced or isolated regions.
Figure 2:
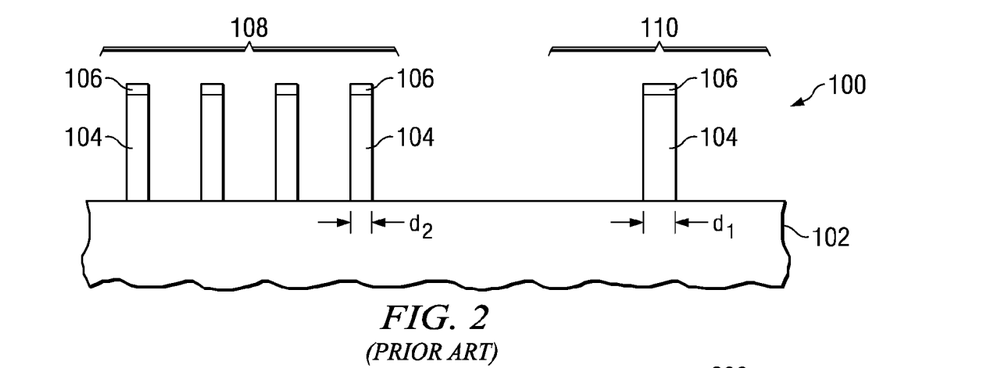

FIGS. 1 and 2 show cross-sectional views of a prior art method of patterning a material layer 104 of a semiconductor device 100, wherein features formed in closely-spaced or nested regions 108 are thinner than features formed in widely-spaced or isolated regions 110. Referring first to FIG. 1, a semiconductor device 100 includes a workpiece 102 or substrate having a material layer 104 to be patterned disposed thereon. A layer of photosensitive material 106 comprising photoresist, for example, is disposed over the material layer 104. The layer of photosensitive material 106 is patterned using a projection lithography system. For example, a lithography mask (not shown) comprising a transparent substrate and a patterned opaque material may be placed between the layer of photosensitive material 106 and a light source (also not shown) that emits light towards the semiconductor device 100. The opaque material of the mask comprises the pattern that will be transferred to the material layer 104 of the semiconductor device 100. For example, the lithography mask may be patterned with a pattern for nested features in region 108 and isolated features in region 110 of the workpiece 102.

When light is directed towards the semiconductor workpiece 100 through the lithography mask, light passes through transparent portions of the mask and is blocked by the opaque portions of the mask, exposing regions of the layer of photosensitive material 106. The layer of photosensitive material 106 is developed, and exposed regions of the layer of photosensitive material 106 are removed, as shown in FIG. 1, e.g., if a positive photoresist is used. Alternatively, a negative photoresist may also be used, for example, not shown. The layer of photosensitive material 106 is then used to pattern the material layer 104, e.g., by etching away exposed portions of the material layer 104. A portion of the layer of photosensitive material 106 may be left residing over the top surface of the patterned material layer 104 after the etch process, as shown in FIG. 2.

A problem with prior art patterning and etch processes is that when very small features are patterned, the features 104 formed in some regions 108 may have a smaller lateral dimension $d_2$ than the lateral dimension $d_1$ of features 104 formed in other regions 110, as illustrated in FIG. 2. Regions 108 of closely-spaced features 104 typically have a smaller lateral dimension $d_2$ than the lateral dimension $d_1$ of features 104 in regions 110 of widely-spaced features, as shown.

The difference in the lateral dimensions $d_1$ and $d_2$ may result from the etch processes used to pattern the material layer 104. For example, the etch processes used to pattern material layers such as material layer 104 typically comprise a combination of competing deposition (or redeposition) and etch reactions. The offset (e.g., the difference between the lateral dimensions ($d_1$ and $d_2$) is believed to be caused by the deposition component of the etch process, for example.

Even if the features 104 in regions 108 and 110 are designed with the same lateral dimension $d_1$, as shown in FIG. 1 (e.g., the layer of photoresist 106 comprises the same dimension $d_1$ for all features 104), they may end up being different (e.g., features 104 may have a lateral dimension $d_2$ in region 108 and a lateral dimension $d_1$ in region 110) in the final semiconductor device 100, as shown in FIG. 2. This can be due to an effect in reactive ion etch processes that is known as "microloading". Microloading refers to a situation where the density of features in the two regions 108 and 110 is different, as shown in FIGS. 1 and 2.

The formation of features 104 of a semiconductor device 100 across a surface of a workpiece 102 is particularly a problem in some applications, e.g., in an application wherein the features 104 comprise gates of transistors. The lateral dimensions $d_1$ and $d_2$ affect operating parameters of the semiconductor devices 100, and thus, if the features 104 have different lateral dimensions $d_1$ and $d_2$, then the devices that the features 104 form will also have different operating parameters, for example. Uniform operating parameters of devices across a surface of a workpiece 102 is usually desired, in most applications.

In some applications and etch processes, "trim" etch processes are often used. In a trim etch process, rather than attempting to transfer the dimensions of the lithography mask patterns 106 as closely as possible to a material layer 104, the lithography mask patterns are intentionally trimmed to a shorter or narrower dimension than the mask dimension during the etching process. For example, in some applications where a material layer 104 will be patterned to form gates of transistors, a trim etch process may be used that trims the gate lengths by about 30 nm to 40 nm. The trim portion of the etch process is typically adjusted by adding more of particular gases, such as $O_2$, to the etch process, or by adjusting the pressure, as examples. Trimming may relax the isolated versus nested feature offset problem that may occur during a dry etch process, for example. During a trim etch process having a high trim amount, the etch component outweighs the deposition component, which can result in comparatively low isolated versus nest feature offsets, for example.

Trim processes may be used to intentionally pattern features having a size that is smaller than the lithography system or tool can print. For example, the desired gate length of transistors may be smaller than a lithography tool can print, and trim processes may be used to achieve a gate length less than the minimum feature size capability of the lithography tool. Trim processes may also be used in the etch process for other lithography and semiconductor applications, for example.

However, as the minimum feature size of semiconductor devices is reduced, a reduced amount of trim may be used in the etch processes, for example, in more recent technology nodes, wherein the minimum feature size is reduced even further. For example, for some specific applications in technology nodes of less than about 100 nm, the amount of trim may be limited to 10 nm or less, e.g., 0 nm to 10 nm. The reduction in the amount of trim that may be used requires adjustments in the etch process such that the deposition component becomes a more significant reaction path. Reducing the amount of trim in the etch process causes an increase in the offset of isolated and nested features, e.g., causing isolated features 104 in regions 110 to have a greater lateral dimension $d_1$ than the lateral dimension $d_2$ of nested features 104 in region 108.

One potential approach to solving the problem of features 104 having different dimensions $d_1$ and $d_2$ in nested and isolated region 108 and 110, respectively, may be to develop a model that describes the isolated/nested region 108/110 offset behavior of the etch process and to modify the circuit design (e.g., modify the pattern of the lithography mask) accordingly, using optical proximity correction (OPC) techniques. A disadvantage of this approach, however, is that once the etch OPC model has been established, the etch process cannot be adjusted. Another disadvantage is that different circuit designs with different relative amounts of open area require a change in the etch OPC model, which is a problem in a foundry environment or when different products are to be manufactured by the same platform technology, for example.

Furthermore, a deviation from the designed data (e.g., the desired pattern to be transferred) can also occur due to deficiencies in the OPC model, meaning that the lithography process results in the printing of features with different lateral dimensions even though they were designed to be the same. In this case the offset (e.g., the difference in $d_1$ and $d_2$ as shown in FIG. 2) is not due to the nested versus isolated feature problem, but rather, due to limitation of or insufficiencies in the OPC model, for example.

Embodiments of the present invention provide methods of reducing or eliminating the offset or difference between the lateral dimensions of nested and isolated features formed on a semiconductor device. First, features are printed and etched using a lithography mask, producing isolated and nested features having different lateral dimensions. The first lithography process is preferably fine-tuned such that the dimensions of the smaller features in the nested regions are on target. A second lithography process is then used to cover the features that are on target with resist. A lateral etch process is used to reduce the features having excessive lateral dimensions, in the isolated regions. The features on target are not affected by the lateral etch process.

Figure 3:
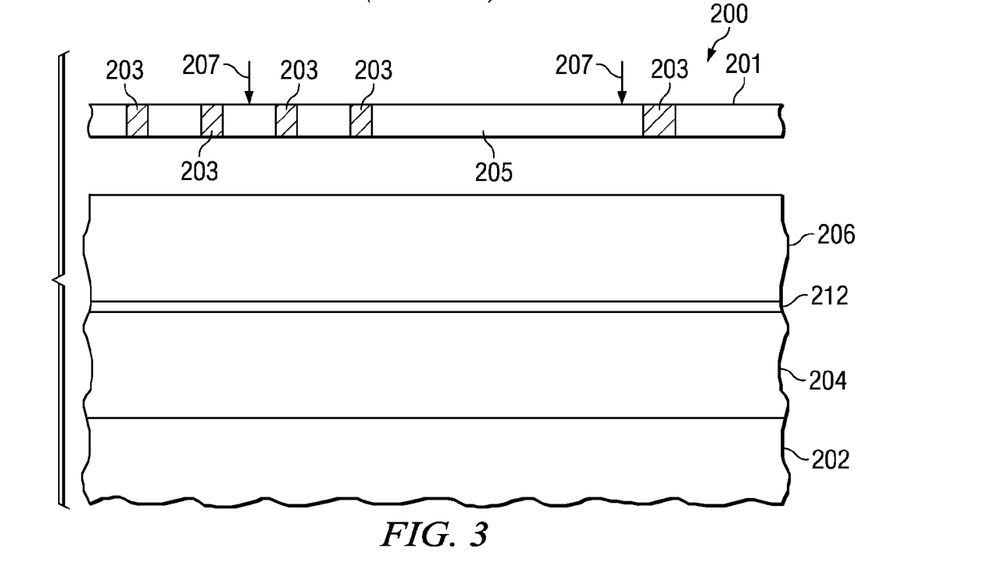
FIGS. 3 through 9 show cross-sectional views of a method of patterning a material layer of a semiconductor device in accordance with a preferred embodiment of the present invention, wherein after features are formed, features in isolated regions but not in nested regions are reduced in a lateral dimension.

FIGS. 3 through 9 show cross-sectional views of a method of patterning a material layer of a semiconductor device 200 in accordance with a preferred embodiment of the present invention. First, a workpiece 202 is provided, as shown in FIG. 3. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may comprise a silicon-on-insulator (SOI) substrate, for example.

A material layer 204 is deposited or formed over the workpiece 202. The material layer 204 may comprise an insulating material, a semiconductive material, a conductive material, or multiple layers or combinations thereof, as examples. In a preferred embodiment, the material layer 204 comprises a semiconductive material such as polysilicon, as an example. The material layer 204 may comprise a single layer of material or multiple layers of materials, for example. The material layer 204 may comprise a thickness of about 500 nm or less, and more preferably comprises a thickness of about 120 nm in one embodiment, although alternatively, the material layer 204 may comprise other dimensions, for example.

Figure 10:
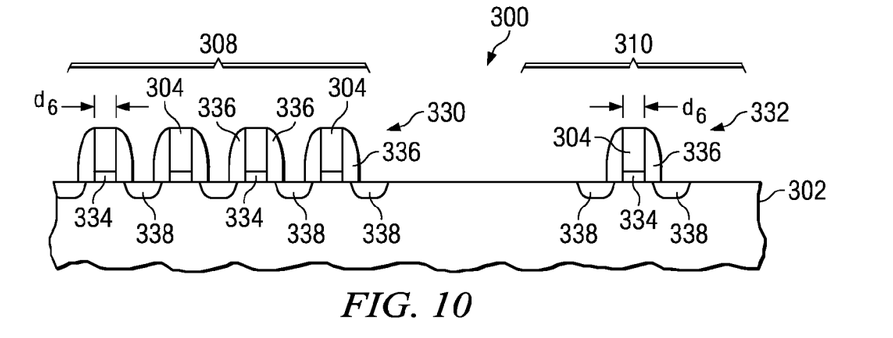
FIG. 10 shows a cross-sectional view of a plurality of transistors formed in accordance with an embodiment of the present invention, wherein gates of transistors in nested regions and isolated regions comprise substantially the same lateral dimensions.

In some embodiments, the material layer 204 may comprise a semiconductive material that will be subtractively etched to form gates of transistors, for example, as shown in FIG. 10 at 304. In this embodiment, preferably, a gate dielectric material 334 (not shown in FIG. 3) is formed over the workpiece 302 before the gate material 304 is deposited, for example. Alternatively, in other embodiments, the material layer 204 may comprise an insulating material that is patterned and later filled with a conductive material, e.g., in a damascene process.

Referring again to FIG. 3, after the material layer 204 is deposited, an anti-reflective coating (ARC) 212 may be deposited over the material layer 204. The ARC 212 may comprise a thickness of about 200 nm or less, and more preferably comprises a thickness of about 90 nm in one embodiment, as an example, although alternatively, the ARC 212 may also comprise other dimensions.

A layer of photosensitive material 206 is formed over the ARC 212, as shown in FIG. 3. The layer of photosensitive material 206 may comprise a photoresist having a thickness of about 250 nm or less, and more preferably comprises a thickness of about 195 nm in one embodiment, for example, although alternatively, the layer of photosensitive material 206 may comprise other dimensions. The layer of photosensitive material 206 is also referred to herein as a first layer of photosensitive material 206, for example.

A first lithography mask 201 is provided, as shown in FIG. 1. The first lithography mask 201 may comprise a binary mask, an alternating phase shifting mask, or other types of masks, for example. The first lithography mask 201 may comprise a plurality of substantially transparent regions 205 that permit light 207 or energy to pass through the mask 201, and a plurality of opaque or translucent regions 203 that block at least a portion of the light 207, for example. The pattern for closely-spaced features (e.g., in the left side of FIG. 3) is preferably optimized with an accurate dimension for the closely-spaced features to be formed, in one embodiment, for example. For example, the first lithography mask 201 preferably comprises a first pattern in a first region 208 (see FIG. 4) of the workpiece 202 and a second pattern in a second region 210 of the workpiece 202, wherein the second pattern comprises at least one second feature comprising the same dimension as a plurality of first features of the first pattern.

Figure 4:
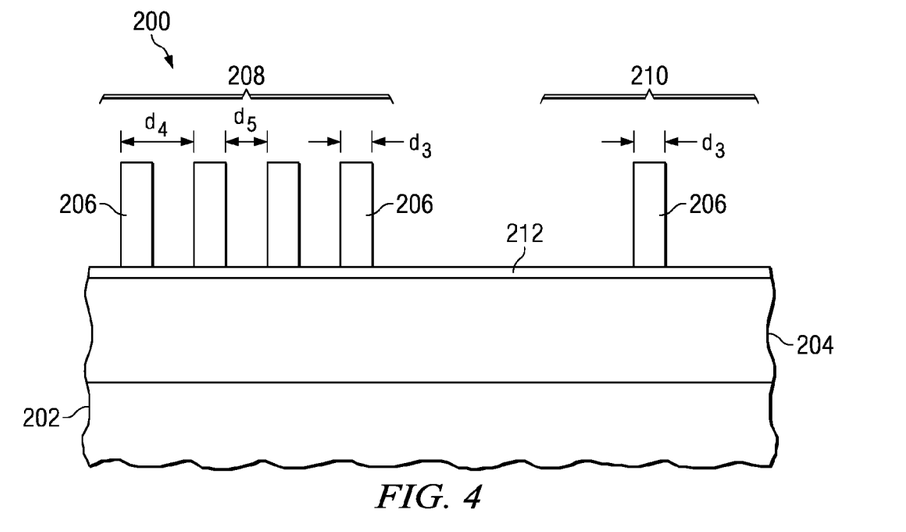

Referring again to FIG. 3, the first lithography mask 201 is then used to pattern the layer of photosensitive material 206 of the semiconductor device 200 using light 207 or energy. The light 207 may be directed at the semiconductor device 200 using a lens system, for example, not shown. The layer of photosensitive material 206 is developed, and exposed regions of the layer of photosensitive material 206 are removed, as shown in FIG. 4. The patterned layer of photosensitive material 206 preferably comprises a pattern comprising at least one first feature in the first region 208 and at least one second feature in the second region 210. The pattern may comprise a plurality of first features in the first region 208, for example, as shown.

The patterned layer of photosensitive material 206 may comprise a pattern for a plurality of closely-spaced features in region 208, with each pattern for a feature comprising a lateral dimension $d_3$. Dimension $d_3$ may comprise a minimum feature size of the semiconductor device 200 in the lithography system being used to pattern the semiconductor device 200, for example. Dimension $d_3$ may comprise about 200 nm or less, and more preferably comprises about 70 to 90 nm or less, as examples, although alternatively, lateral dimension $d_3$ may comprise other dimensions. The distance from a left edge of one pattern 206 to a left edge of an adjacent pattern 206 may comprise a lateral dimension $d_4$. Lateral dimension $d_4$ may comprise the pitch, for example. The distance or space between the patterns 206 may comprise a lateral dimension $d_5$. The dimension $d_5$ may comprise dimension $d_3$ or greater, for example, although alternatively, dimension $d_5$ may comprise other dimensions.

The patterned layer of photosensitive material 206 may comprise a pattern for at least one isolated or widely-spaced feature in region 210, as shown, wherein the pattern 206 comprises a lateral dimension $d_3$. The lateral dimensions $d_3$ of the pattern for the features in the first region 208 and the second region 210 are preferably substantially equal in some embodiments, for example.

Figure 5:
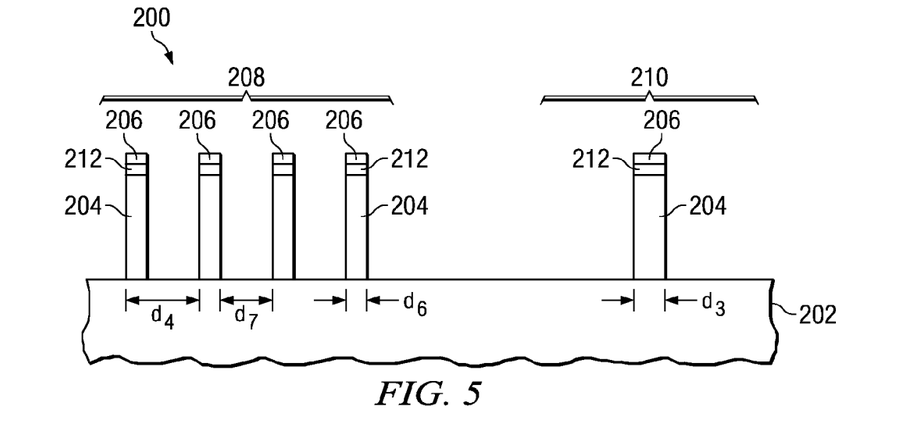

The layer of photosensitive material 206 is then used as a mask while the material layer 204 is patterned (e.g., exposed portions of the material 204 not protected by the layer of photosensitive material 206 are removed using an etch process), transferring the pattern of the layer of photosensitive material 206 to the material layer 204, as shown in FIG. 5. First, the ARC 212 is etched away or opened, and then an etch process is used to etch away exposed portions of the material layer 204, leaving portions of the material layer 204 left residing under the layer of photosensitive material 206. The etch process preferably comprises a dry etch process suitable for removing the type of material of the material layer 204 to be patterned, for example, although alternatively, the etch process may comprise a wet etch process or other types of etch processes.

Because the first region 208 comprises closely-spaced or nested features 204, the etch process results in features 204 formed in the first region 208 comprising a dimension $d_6$ that is less than the dimension $d_3$ of features formed in the second region 210, for example. However, because the second region 210 comprises widely-spaced or isolated features 204, the dimension $d_3$ of the features 204 formed in the second region 210 may be substantially equal to the dimension $d_3$ of the pattern for the features in the layer of photosensitive material 206 shown in FIG. 4 in the second region 210, for example.

In some embodiments, the lateral dimension $d_6$ of features 204 in the first region 208 may comprise a dimension less than a minimum feature size of the semiconductor device 200; e.g., a minimum feature size reduced by a predetermined amount. The predetermined amount may comprises about 25% or less of the minimum feature size, as an example, although alternatively, the lateral dimension $d_6$ may alternatively comprise other dimensions. If the minimum feature size of the semiconductor device 200 comprises 90 nm, the lateral dimension $d_6$ may comprise about 68 to 85 nm, as examples.

Preferably, the etch process to pattern the material layer 204 and the dimensions on the first lithography mask 201 are optimized to produce a well-controlled lithography process, resulting in the formation of features 204 in the first region 208 that have a predetermined, well-controlled dimension $d_6$, for example. At this stage of the manufacturing process, the features 204 in the second region 210 comprise a lateral dimension $d_3$ that is greater than the lateral dimension $d_6$ of features 204 in the first region 208. The lateral dimension $d_3$ later is reduced using an additional lithography and etch process, to be described further herein. The lateral dimension $d_7$ between adjacent features 204 in the first region 208 comprises an amount greater than $d_3$ and $d_5$, as examples.

Figure 6:
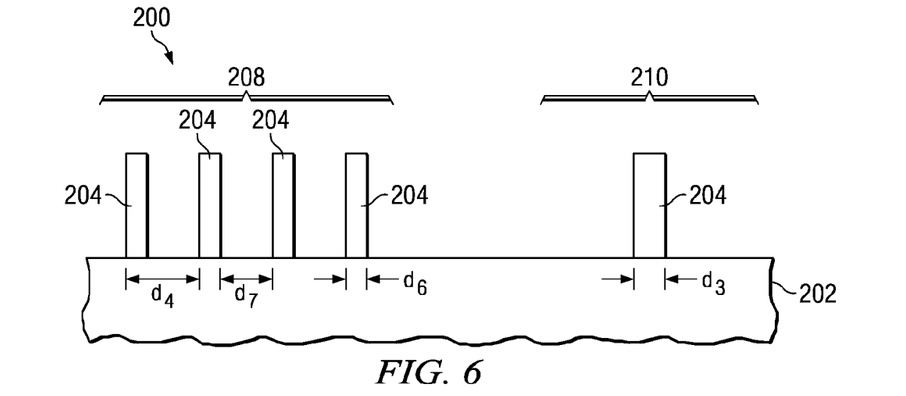

The layer of photosensitive material 206 is then stripped or removed, and the ARC 212 is removed, as shown in FIG. 6.

Note that the material layer 204 may include a hard mask disposed over a layer of material to be patterned, not shown. The hard mask may comprise an insulating material, such as $SiO_2$, $Si_xN_y$, combinations thereof, or other materials, for example. In some embodiments, for example, the layer of photosensitive material 206 is patterned using the lithography mask, and then the layer of photosensitive material 206 is used to pattern the hard mask. The layer of photosensitive material 206 may then be removed, and the hard mask is used to pattern the material layer, for example. Or, alternatively, both the layer of photosensitive material 206 and the hard mask are used to pattern the material layer, for example. The hard mask may be left remaining, or it may be removed, for example.

Figure 7:
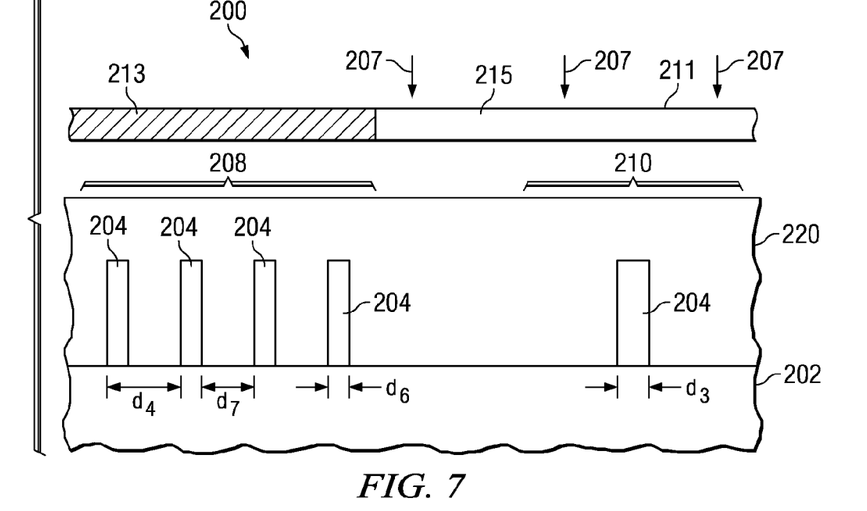

Next, a second layer of photosensitive material 220 is deposited over the features 204 and over exposed areas of the workpiece 202, as shown in FIG. 7. The second layer of photosensitive material 220 preferably comprises a layer of photoresist having a thickness of about 700 nm or less, for example. As another example, the second layer of photosensitive material 220 may comprise a thickness of about 248 nm above the top surface of the features 204. Alternatively, the second layer of photosensitive material 220 may comprise other dimensions.

A second lithography mask 211 is provided, as shown in FIG. 7, wherein the second lithography mask 211 is adapted to allow light 207 to pass through the mask 211 and expose the second region 210 of the workpiece 202, e.g., in transparent regions 215. The second lithography mask 211 preferably comprises opaque regions 213 that are adapted to block the light 207, as shown. Advantageously, because relatively large regions 208 and 210 are exposed and unexposed using the second lithography mask 211, the alignment process of the lithography mask 211 to the workpiece 202 (e.g., the workpiece 202 includes alignment marks or structures formed therein that are used for alignment, not shown in the drawings) may be relaxed, for example.

The second lithography mask 211 is used as a mask to pattern the second layer of photosensitive material 220, by passing light 207 through the mask 211. The second layer of photosensitive material 220 is developed and removed, as shown in FIG. 8.

Figure 8:
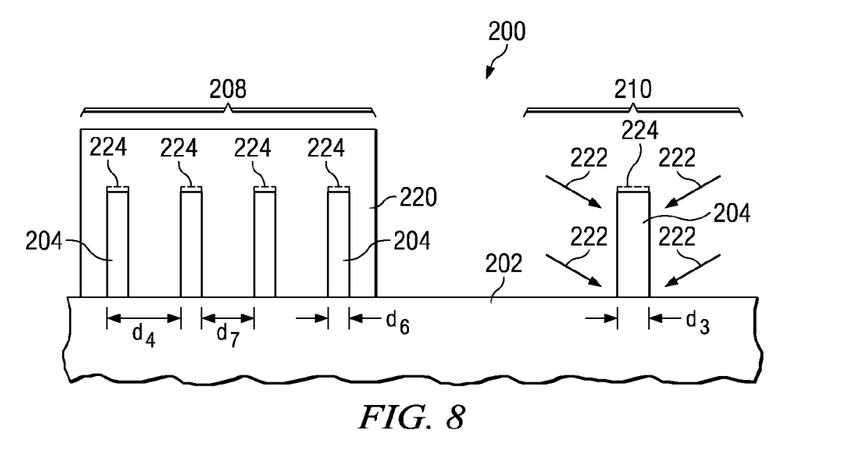

The workpiece 202 is exposed to a lateral etch process 222, also shown in FIG. 8. The second layer of photosensitive material 220 protects the features 204 in the first region 208 of the workpiece 202, yet the lateral dimension $d_3$ of the features 204 in the second region 210 of the workpiece 202 is reduced. The lateral etch process 222 preferably comprises a dry etch process that includes an isotropic component, for example. Alternatively, wet etch processes and other etch processes may also be used. Preferably, the lateral etch process 222 is selected and controlled such that the lateral dimension $d_3$ of the features 204 in the second region 210 of the workpiece 202 is reduced so that the lateral dimension of the features 204 in the second region 210 comprises a dimension $d_6$ that is substantially equal to the lateral dimension $d_6$ of features 204 in the first region 208 after the lateral etch process 222, as shown in FIG. 9.

Figure 9:
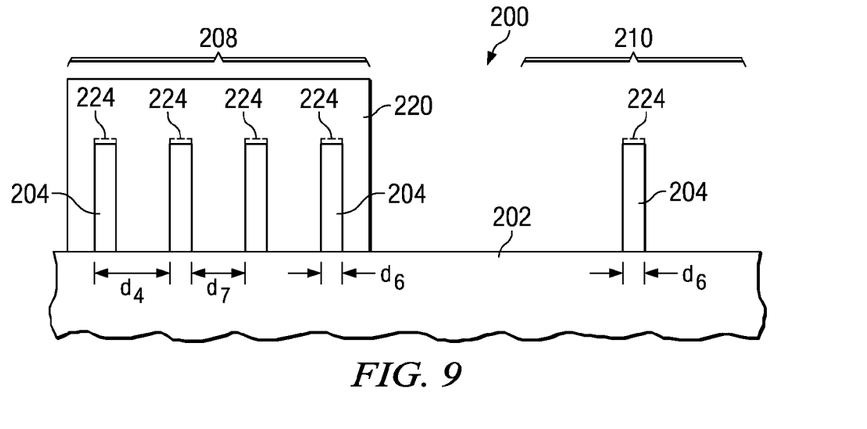

Note that in some embodiments, preferably an optional insulating material 224, shown in phantom in FIGS. 8 and 9, is disposed on the top surface of the features 204. For example, if the material layer comprises polysilicon, the insulating material 224 may comprise a native oxide comprising $SiO_2$, or the insulating material 224 may comprise a thin layer of $SiO_2$, $Si_xN_y$, or SiON that is deposited or formed on the top surface of the material layer 204 after the material layer 204 is deposited. The insulating material 224 protects the top surface of the features 204 in the second region 210 during the lateral etch process 222, so that the height of the features 204 is not reduced. The etch process 222 may be adapted to etch the material layer 204 but not the insulating material 224, e.g., the etch process 222 may be selective to the insulating material 224, for example. The optional insulating material 224 may comprise at least a portion of a hard mask that is left remaining over the features 204, for example.

In accordance with some embodiments, the first etch process (shown in FIG. 4) used to pattern the features 204 is adjusted or tuned, preferably during the ARC 212 open portion of the first etch process, such that the nested features 204 are on target, e.g., the features 204 in region 208 comprise a predetermined lateral dimension $d_6$. After the first etch process, a second lithography step (shown in FIGS. 7 and 8) follows, in which the nested features 204 in region 208 are covered with resist (e.g., photosensitive material 220), leaving the isolated features 204 in region 210 exposed. In the second etch process, (e.g., lateral etch process 222) the existing isolated lines (e.g., features 204 in region 210) are laterally etched until they are also on target, e.g., until the features 204 in region 210 comprise the predetermined lateral dimension $d_6$.

Embodiments of the invention may be used to pattern many types of features wherein it is desirable that features in some geographic region have the same lateral dimensions as features in another geographic region. For example, embodiments of the present invention may be used to form transistor gates 304, as shown in FIG. 10. FIG. 10 shows a cross-sectional view of a plurality of transistors 330 and 332 formed in accordance with an embodiment of the present invention, wherein the gates 304 in the nested regions 308 and the gates 304 in the isolated regions 310 comprise substantially the same lateral dimensions. Like numerals are used for the various elements in FIG. 10 that were used to describe elements in the previous figures, and to avoid repetition, each reference number shown in FIG. 10 is not described again in detail herein. Rather, similar materials x02, x04, x06, etc. . . . are preferably used for the various material layers shown as were described for FIGS. 3 through 9, where x=2 in FIGS. 3 through 9, and x=3 in FIG. 10.

Before the material layer 304 is deposited, a gate dielectric 334 is formed over the workpiece 302, as shown in FIG. 10. The gate dielectric may comprise a thickness of about 5 nm or less, for example. The gate dielectric 334 may comprise $SiO_2$ or other insulating materials, as examples. The material layer 304 comprising a gate material such as polysilicon is deposited over the gate dielectric 334. The gate material 304 may include a native oxide (e.g., such as insulating material 224 shown in FIG. 9) formed on the top surface thereof, for example, not shown. The gate material 304 may also comprise a metal, a combination or multiple layers of polysilicon and metals, or other conductive materials, as examples.

The gate material 304 is patterned to form a plurality of gates, as previously described with reference to FIGS. 3 through 9 herein. After the gate material 304 is patterned, sidewall spacers 336 comprising an insulator are formed on the sidewalls of the gates 304 and gate dielectric 334. Source and drain regions 338 are formed by implanting dopants into the top surface of the workpiece 302, forming the junctions of the transistors 330 and 332. A channel region is formed between the source and drain regions 338 below each gate dielectric 334, for example.

Advantageously, the gates 304 comprise substantially the same lateral dimension $d_6$ in the first region 308 of closely-spaced transistors 330 and also in the second region 310 of isolated transistors 332, in accordance with an embodiment of the present invention. The lateral dimension $d_6$ may comprise a gate length of the transistors 330 and 332, for example. Thus, advantageously, the transistors 330 and 332 in the first and second regions 308 and 310, respectively, comprise substantially the same operating parameters and characteristics.

Embodiments of the present invention may be used in lithography masks comprising opaque and transparent regions, in alternating phase-shift masks, combinations thereof, and other types of lithography masks, for example. FIGS. 3 and 7 show embodiments of the invention implemented in binary lithography masks 201 and 211, respectively, for example. The masks 201 and 211 may comprise a substantially transparent material 205 and 215 comprising quartz glass having a thickness of about ¼", with a non-transparent material 203 and 213 such as chromium, which is opaque, having a thickness of about 30 nm bonded to the quartz glass. Alternatively, the non-transparent material 203 and 213 may comprise about 70 nm of a translucent material such as molybdenum silicon (MoSi), or a bilayer of tantalum and silicon dioxide ($Ta/SiO_2$). Alternatively, other materials and dimensions may also be used for the transparent material 205 and 215 and the non-transparent material 203 and 213 of the masks 201 and 211, for example.

Embodiments of the present invention may comprise lithography mask sets including the first lithography mask 201 shown in FIG. 3 and the second lithography mask 211 shown in FIG. 7. Other lithography masks (not shown) for patterning other material layers of the semiconductor devices 200/300/400 may also be included in the lithography mask sets, for example.

Figure 11:
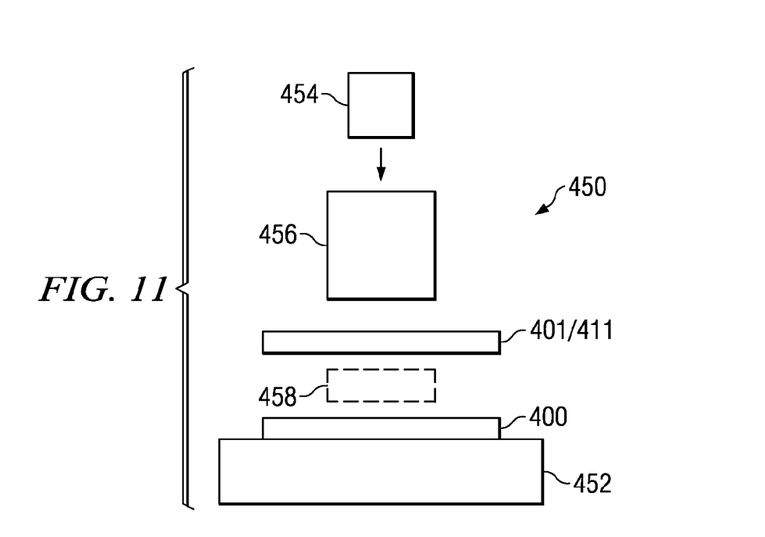
FIG. 11 illustrates a lithography system adapted to implement the novel lithography mask sets in accordance with an embodiment of the present invention.

FIG. 11 illustrates a lithography system 450 adapted to implement the novel lithography mask sets 401/411 (e.g., such as mask 201 and 211 previously described herein) in accordance with an embodiment of the present invention. Again, like numerals are used for the various elements that were used to describe the previous drawings, and to avoid repetition, each reference number shown in FIG. 11 is not described again in detail herein.

The lithography system 450 includes a support 452 for a wafer or workpiece of a semiconductor device 400. A light source 454 is disposed above the semiconductor device 400. A lens system 456 is adapted to direct light from the light source 454 towards a mask 401 or 411 to impinge upon a layer of photosensitive material disposed on the semiconductor device 400.

The lithography system 450 that the novel masks 401/411 are used in may comprise an immersion lithography system, in some embodiments. In this embodiment, the lithography system 450 may include a projection lens system 458 (shown in phantom in FIG. 11) disposed between the mask 401/411 and the semiconductor device 400. The projection lens system 458 includes an immersion head that is adapted to introduce a fluid between a last element or lens of the projection lens system 458 and the semiconductor device 400 during the exposure process, for example.

Thus, embodiments of the present invention include lithography systems 450 that include or are adapted to implement the novel lithography masks 401/411 and mask sets described herein.

Embodiments of the present invention are described herein with reference to optical lithography systems 450 and masks 401/411, and may be implemented in lithography systems 450 that utilize ultraviolet (UV) or extreme UV (EUV) light, as examples. The novel lithography mask sets 201, 211, 401, and 411 and patterning methods described herein may also be used in non-optical lithography systems, x-ray lithography systems, interference lithography systems, short wavelength lithography systems, Scattering with Angular Limitation in Projection Electron-beam Lithography (SCALPEL) systems, and immersion lithography systems, or other lithography systems that utilize lithography masks, as examples.

The novel features 204/304 described herein may also comprise conductive lines, vias, capacitor plates, and other features, as examples, that have a different pattern in the second region 210/310 and the first region 208/308 after a first etch process, and thus the features comprise different dimensions in the first region 208/308 and the second region 210/310. Embodiments of the present invention may be used to pattern features of memory devices, logic circuitry, and/or power circuitry, as examples, although other types of ICs may also be fabricated using the novel patterning methods and mask sets described herein.

Embodiments of the present invention may be used to solve other types of unwanted offset problems that may occur in other applications than in isolated/nested regions 208/308 and 210/310 shown and described herein. For example, in memory applications, the lateral dimensions of some features such as conductive lines may deviate from the lateral dimensions of other conductive lines having a similar pitch after a first lithography step, which cannot be successfully addressed by OPC. Embodiments of the present invention may be used in such applications, for example, to solve the offset problem by masking the conductive lines having the correct dimension, and laterally etching the conductive lines having the lateral dimensions of excessive size, advantageously producing conductive lines or other features across an entire workpiece that comprise the same lateral dimensions.

Advantages of embodiments of the invention include providing novel methods of patterning features in a material layer, wherein the features comprise the same lateral dimension across a surface of a workpiece, regardless of the region of the workpiece the features are formed in, and regardless of the density of the features. Advantageously, nested features comprise substantially the same lateral dimension as isolated features, in accordance with preferred embodiments of the present invention, due to the novel second etch process to decrease the lateral dimension of the isolated features. Thus, circuits and devices formed in nested and isolated areas comprise substantially the same performance characteristics, such as speed, resistance, current, and other parameters, as examples.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of designing a lithography mask set, the method comprising:
    designing a layout for a semiconductor device, the layout including a plurality of first features in a first region of a workpiece and a second feature in a second region of the workpiece, the plurality of first features and the second feature of the layout comprising a first lateral dimension;
    designing a first lithography mask adapted to pattern a workpiece with the plurality of first features in the first region of the workpiece and the second feature in the second region of the workpiece, the first lithography mask including a first pattern for the first features in the first region of the workpiece that is optimized to produce the plurality of first features in the first region of the workpiece comprising the first lateral dimension or less, the first lithography mask including a second pattern for the second feature that is adapted to produce the second feature in the second region of the workpiece having a second lateral dimension, the second lateral dimension being greater than the first lateral dimension; and
    designing a second lithography mask adapted to mask the first region of the workpiece while the second lateral dimension is reduced without removing the second feature.

2. The method according to claim 1, wherein the first pattern of the first lithography mask for the first features in the first region of the workpiece comprises a minimum feature size of the semiconductor device.

3. The method according to claim 1, wherein designing the first lithography mask and designing the second lithography mask comprise designing binary lithography masks or alternating phase shifting masks.

4. The method according to claim 1, wherein designing the first lithography mask and designing the second lithography mask comprise designing binary lithography masks.

5. The method according to claim 1, wherein designing the first lithography mask and designing the second lithography mask comprise designing alternating phase shifting masks.

6. The method according to claim 1, wherein the lithography mask set is configured to be used in an optical lithography system, a non-optical lithography system, an x-ray lithography system, an interference lithography systems, a short wavelength lithography system, a Scattering with Angular Limitation in Projection Electron-beam Lithography (SCALPEL) system, or an immersion lithography system.

7. A lithography mask set comprising:
    a first lithography mask for patterning a first region and a second region of a workpiece, the first lithography mask comprising a first pattern in the first region of the workpiece and a second pattern in the second region of the workpiece, the second pattern comprising a second feature comprising the same dimension as a plurality of first features of the first pattern; and
    a second lithography mask, the second lithography mask being adapted to expose the second region, but not the first region of the workpiece, wherein when the first lithography mask is used to pattern a material layer of a workpiece, the second feature is formed in the second region of the workpiece having a greater lateral dimension than a plurality of first features formed in the first region of the workpiece, and wherein the second lithography mask is adapted to mask the first region of the workpiece while the lateral dimension of the second feature is reduced without removing the second feature.

8. The lithography mask set according to claim 7, wherein the plurality of first features of the first lithography mask comprise closely spaced features.

9. The lithography mask set according to claim 8, wherein the second feature comprises an isolated feature.

10. The lithography mask set according to claim 8, wherein the lithography mask set is configured to be used in an optical lithography system, a non-optical lithography system, an x-ray lithography system, an interference lithography systems, a short wavelength lithography system, a Scattering with Angular Limitation in Projection Electron-beam Lithography (SCALPEL) system, or an immersion lithography system.

11. A lithography system comprising:
 a first lithography mask for patterning a first region and a second region of a workpiece, the first lithography mask comprising a first pattern in the first region of the workpiece and a second pattern in the second region oldie workpiece, the second pattern comprising a second feature comprising the same dimension as a plurality of first features of the first pattern; and
 a second lithography mask, the second lithography mask being adapted to expose the second region, but not the first region of the workpiece, wherein when the first lithography mask is used to pattern a material layer of a workpiece, the second feature is formed in the second region of the workpiece having a greater lateral dimension than a plurality of first features formed in the first region of the workpiece, and wherein the second lithography mask is adapted to mask the first region of the workpiece while the lateral dimension of the second feature is reduced without removing the second feature.

12. The lithography system according to claim 11, wherein the lithography system comprises an optical lithography system.

13. The lithography system according to claim 11, wherein the lithography system comprises a non-optical lithography system.

14. The lithography system according to claim 11, wherein the lithography system comprises an x-ray lithography system.

15. The lithography system according to claim 11, wherein the lithography system comprises an interference lithography system or a short wavelength lithography system.

16. The lithography system according to claim 11, wherein the lithography system comprises a Scattering with Angular Limitation in Projection Electron-beam Lithography (SCALPEL) system.

17. The lithography system according to claim 11, wherein the lithography system comprises an immersion lithography system.

18. The lithography system according to claim 11, wherein the plurality of first features of the first lithography mask comprise closely spaced features, and wherein the second feature comprises an isolated feature.

* * * * *

UNITED STATES PATENT AND TRADEMARK OFFICE
CERTIFICATE OF CORRECTION

PATENT NO. : 8,349,528 B2  Page 1 of 1
APPLICATION NO. : 13/164139
DATED : January 8, 2013
INVENTOR(S) : Lipinski et al.

It is certified that error appears in the above-identified patent and that said Letters Patent is hereby corrected as shown below:

In the Specification

In Col. 13, line 19, claim 11, delete "oldie" insert --of the--.

Signed and Sealed this
Sixteenth Day of July, 2013

Teresa Stanek Rea
*Acting Director of the United States Patent and Trademark Office*